US008492849B2

(12) United States Patent
Tai et al.

(10) Patent No.: US 8,492,849 B2
(45) Date of Patent: Jul. 23, 2013

(54) HIGH SIDE SEMICONDUCTOR STRUCTURE

(75) Inventors: Han-Chung Tai, Kaohsiung (TW); Hsin-Chih Chiang, Hsinchu (TW)

(73) Assignee: System General Corp., Taipei (TW)

( * ) Notice: Subject to any disclaimer, the term of this patent is extended or adjusted under 35 U.S.C. 154(b) by 148 days.

(21) Appl. No.: 12/832,727

(22) Filed: Jul. 8, 2010

(65) Prior Publication Data
US 2011/0180878 A1 Jul. 28, 2011

(30) Foreign Application Priority Data
Jan. 27, 2010 (CN) .......................... 2010 1 0118974

(51) Int. Cl.
*H01L 31/119* (2006.01)
*H01L 21/336* (2006.01)
(52) U.S. Cl.
USPC ........... 257/371; 257/296; 257/368; 257/369; 257/373; 257/376; 257/E21.41; 257/E21.632; 257/E21.644; 257/E27.062; 365/185.24; 438/232; 438/268; 438/275; 438/286
(58) Field of Classification Search
USPC .................. 257/296, 368, 369, 371, 373, 376, 257/E21.41, E21.632, E21.644, E27.062; 365/185.24; 438/232, 268, 275, 286
See application file for complete search history.

(56) References Cited

U.S. PATENT DOCUMENTS

| | | | | |
|---|---|---|---|---|
| 5,119,159 A | * | 6/1992 | Hoshi | 257/328 |
| 5,242,841 A | * | 9/1993 | Smayling et al. | 438/275 |
| 6,025,621 A | * | 2/2000 | Lee et al. | 257/296 |
| 6,472,715 B1 | * | 10/2002 | Liu et al. | 257/371 |
| 8,110,878 B2 | * | 2/2012 | Morino et al. | 257/371 |
| 2003/0071314 A1 | * | 4/2003 | Jang et al. | 257/371 |
| 2005/0179472 A1 | * | 8/2005 | Nakamura et al. | 327/109 |
| 2012/0184077 A1 | * | 7/2012 | Bahl et al. | 438/268 |

* cited by examiner

*Primary Examiner* — Dao H Nguyen
(74) *Attorney, Agent, or Firm* — McClure, Qualey & Rodack, LLP

(57) ABSTRACT

A high side semiconductor structure is provided. The high side semiconductor structure includes a substrate, a first deep well, a second deep well, a first active element, a second active element and a doped well. The first deep well and the second deep well are formed in the substrate, wherein the first deep well and the second deep well have identical type of ion doping. The first active element and the second active element are respectively formed in the first deep well and the second deep well. The doped well is formed in the substrate and is disposed between the first deep well and the second deep well. The doped well, the first deep well and the second deep well are interspaced, and the type of ion doping of the first deep well and the second deep well is complementary with that of the doped well.

10 Claims, 2 Drawing Sheets

HIGH SIDE SEMICONDUCTOR STRUCTURE

This application claims the benefit of People's Republic of China application Serial No. 201010118974.1, filed Jan. 27, 2010, the subject matter of which is incorporated herein by reference.

BACKGROUND OF THE INVENTION

1. Field of the Invention

The invention relates in general to a semiconductor structure, and more particularly to a high side semiconductor structure.

2. Description of the Related Art

Along with the advance in the development of semiconductor, the high side semiconductor structure is thus provided. The high side semiconductor structure forms a deep well doped with ions on the substrate. The semiconductor is disposed in the deep well so that larger reference withstanding voltage (also known as breakdown voltage) is generated.

In many applications, the designer has to make attempt to increasing the reference withstanding voltage of the high side semiconductor structure. However, it is not an easy job to increase the reference withstanding voltage of the high side semiconductor structure. In order to change the reference withstanding voltage of the high side semiconductor structure, the lithography process needs to be performed extra times during the manufacturing process, and the operating voltage of the high side semiconductor structure may be changed.

Thus, how to provide a high side semiconductor structure with increased reference withstanding voltage, simplify the manufacturing process, and keeps the operating voltage unchanged has become a prominent task for the semiconductor industry.

SUMMARY OF THE INVENTION

The invention is directed to a high side semiconductor structure. The doped well, the first deep well and the second deep well are interspaced, so that the reference withstanding voltage of the high side semiconductor structure is increased, the manufacturing process thereof is simple and the operating voltage thereof is kept being unchanged.

According to a first aspect of the present invention, a high side semiconductor structure is provided. The high side semiconductor structure includes a substrate, a first deep well, a second deep well, a first active element, a second active element and a doped well. The first deep well and the second deep well are formed in the substrate, wherein the first deep well and the second deep well have identical type of ion doping. The first active element and the second active element are respectively formed in the first deep well and the second deep well. The doped well is formed in the substrate and is disposed between the first deep well and the second deep well. The doped well, the first deep well and the second deep well are interspaced, and the type of ion doping of the first deep well and the second deep well is complementary with that of the doped well.

The invention will become apparent from the following detailed description of the preferred but non-limiting embodiments. The following description is made with reference to the accompanying drawings.

DETAILED DESCRIPTION OF THE INVENTION

A number of preferred embodiments are disclosed below for elaborating the details of the invention. However, the invention is not limited to the embodiments, and the embodiments are for elaborating the invention not for limiting the scope of protection of the invention. Moreover, secondary elements are omitted in the embodiments to highlight the characteristics of the invention.

First Embodiment

Figure 1:
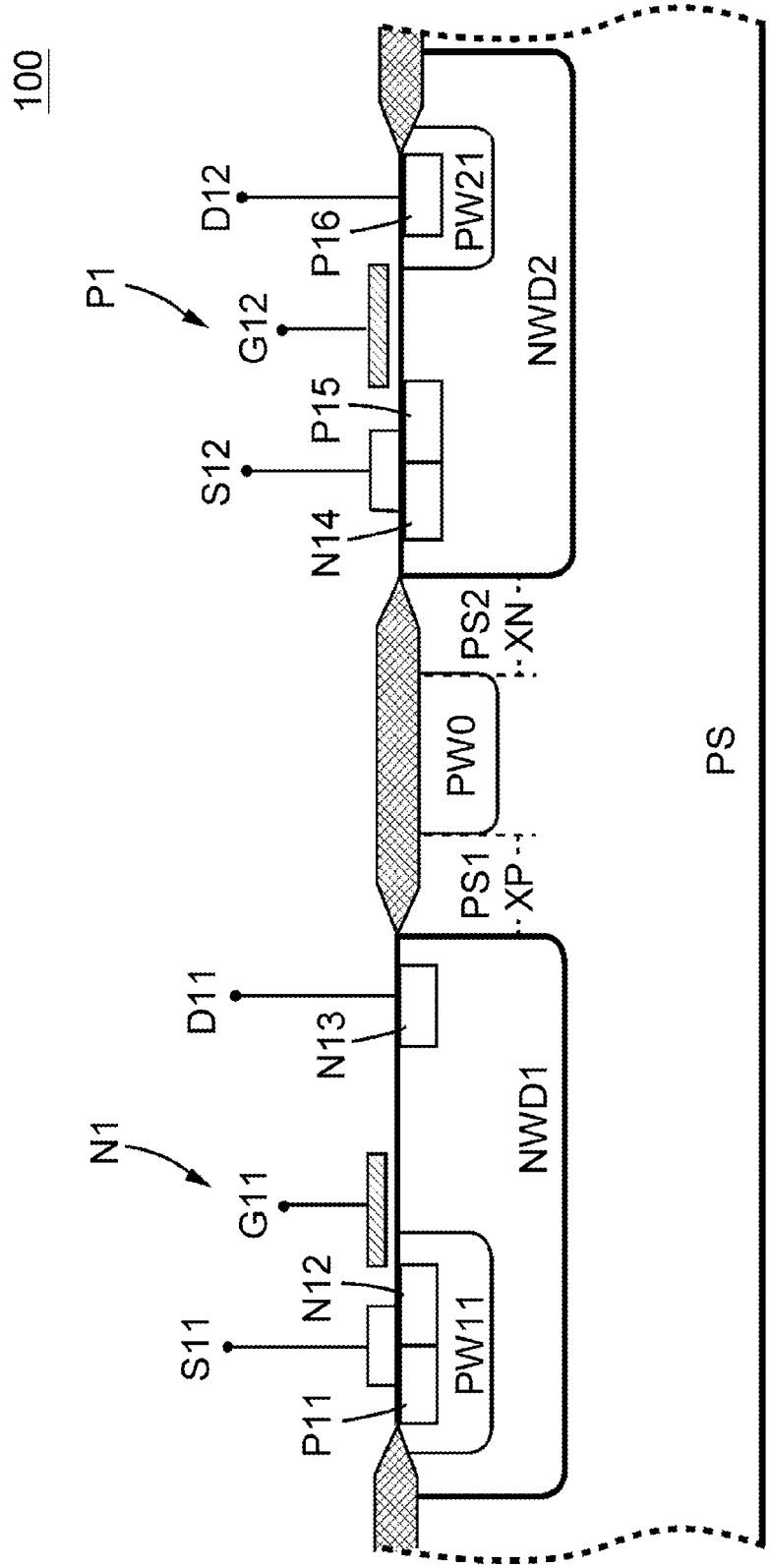
FIG. 1 shows a schematic diagram of a high side semiconductor structure according to the first embodiment of the invention.

Referring to FIG. 1, a schematic diagram of a high side semiconductor structure 100 according to the first embodiment of the invention is shown. The high side semiconductor structure 100 of the present embodiment of the invention includes a substrate PS, a first deep well NWD1, a second deep well NWD2, a first active element N1, a second active element P1 and a doped well PW0.

The first deep well NWD1 and the second deep well NWD2 are formed in the substrate PS, wherein the first deep well NWD1 and the second deep well NWD2 have identical type of ion doping. In the present embodiment of the invention, the substrate PS is realized by a P-type substrate, and the first deep well NWD1 and the second deep well NWD2 both are realized by an N-type deep well.

The first active element N1 and the second active element P1 are respectively formed in the first deep well NWD1 and the second deep well NWD2. In the present embodiment of the invention, the first active element N1 is realized by an N-type metal oxide semiconductor (NMOS), and the second active element P1 is realized by a P-type metal oxide semiconductor (PMOS).

In the present embodiment of the invention, the first active element N1 includes a gate G11, a source S11, a drain D11, a doped well PW11 and three heavy ion doped regions P11, N12, N13. The P-type doped well PW11 is formed in the N-type first deep well NWD1. The P-type heavy ion doped region P11 and the N-type heavy ion doped region N12 are formed in the P-type doped well PW11. The N-type heavy ion doped region N13 is formed in the N-type first deep well NWD1. The source S11 is disposed on the P-type heavy ion doped region P11 and the N-type heavy ion doped region N12. The drain D11 is disposed on the N-type heavy ion doped region N13. The gate G11 is disposed on the N-type first deep well NWD1.

In the present embodiment of the invention, the second active element P1 includes a gate G12, a source S12, a drain D12, a doped well PW21 and, three heavy ion doped regions N14, P15, P16. The P-type doped well PW21 is formed in the N-type second deep well NWD2. The N-type heavy ion doped region N14 and the P-type heavy ion doped region P15 are formed in the N-type second deep well NWD2. The P-type heavy ion doped region $P_{16}$ is formed in P-type doped well PW21. The source S12 is disposed on the N-type heavy ion doped region N14 and the P-type heavy ion doped region P15. The drain D12 is disposed on P-type heavy ion doped region P16. The gate G12 is disposed on the N-type second deep well NWD2.

The doped well PW0 is formed in the substrate PS, and is disposed between the first deep well NWD1 and the second deep well NWD2. In the present embodiment of the invention, the doped well PW0 is realized by a P-type doped well.

The doped well PW0, the first deep well NWD1 and the second deep well NWD2 are interspaced, and are not connected with each other. That is, a first gap region PS1 is disposed between the doped well PW0 and the first deep well NWD1, and a second gap region PS2 is disposed between the doped well PW0 and the second deep well NWD2. What is interposed between the first gap region PS1 and the second gap region PS2 is the P-type substrate PS, not the P-type doped well PW0.

A P-N junction is formed between the N-type element and the P-type element. The relations of the P-N junction are expressed in formula (1) and formula (2) below:

$$X_P \times N_P = X_N \times N_N = K \quad (1)$$

$$B_V = E \times (X_N + X_P) \quad (2)$$

Wherein,
$X_p$ denotes the thickness of the depletion region of a P-type element;
$N_P$ denotes the ion doping concentration of a P-type element;
$X_N$ denotes the thickness of the depletion region of a N-type element;
$N_N$ denotes the ion doping concentration of a N-type element;
$B_V$ denotes a reference withstanding voltage;
E denotes an electrical field.

According to formula (1), when the ion doping concentration $N_p$ of the P-type element drops, the thickness $X_P$ of the depletion region of the P-type element increases accordingly.

According to formula (2), when the thickness $X_P$ of the depletion region of the P-type element increases, the reference withstanding voltage $B_V$ increases accordingly.

In the present embodiment of the invention, a P-N junction is formed between the N-type first deep well NWD1 and the P-type first gap region PS1. What is connected to the P-type first gap region $PS_1$ is the N-type first deep well NWD1, not the P-type doped well PW0. The ion doping concentration of the P-type first gap region PS1 is lower than that of the P-type doped well PW0, so that the depletion region of the P-type first gap region PS1 is thicker, and the reference withstanding voltage is larger.

The results of several experiments show that when the N-type first deep well NWD1 and the P-type doped well PW0 are interconnected, the reference withstanding voltage is 50V, but when the N-type first deep well NWD1 and the P-type first gap region PS1 are interconnected, the reference withstanding voltage is increased to 100V.

Likewise, in the present embodiment of the invention, a P-N junction is formed between the N-type second deep well NWD2 and the P-type second gap region PS2. What is connected to the P-type second gap region PS2 is the N-type second deep well NWD2, not the P-type doped well PW0. The ion doping concentration of the P-type second gap region PS2 is lower than that of the P-type doped well PW0, so that the depletion region of the P-type second gap region PS2 is thicker, and the reference withstanding voltage is larger.

The results of several experiments show that when the N-type second deep well NWD2 well and the P-type doped well PW0 are interconnected, the reference withstanding voltage is 50V, but when the N-type second deep well NWD2 and the P-type second gap region PS2 are interconnected, the reference withstanding voltage is increased to 100V.

Moreover, the increase in the first gap region PS1 and the second gap region PS2 does not affect the operating voltages of the first active element N1 and the second active element P1, and the operating voltages of the first active element N1 and the second active element P1 still can maintain at 30V.

Preferably, when the width XP of the first gap region PS1 and the width XN of the second gap region PS2 are both larger than 4 μm, the first gap region PS1 and the second gap region PS2 can expose the full thickness of the depletion region for increasing the reference withstanding voltage to a desired level.

In an embodiment, the first deep well NWD1 and the second deep well NWD2 are moved outward for generating the first gap region PS1 and the second gap region PS2. Thus, the width of the P-type doped well PW0 does not shrink, and the function of the P-type doped well PW0 is not affected.

In the present embodiment of the invention, the width XP of the first gap region PS1 is substantially identical to the width XN of the second gap region PS2, so that balance can be maintained between the first active element N1 and the second active element P1.

Second Embodiment

Figure 2:
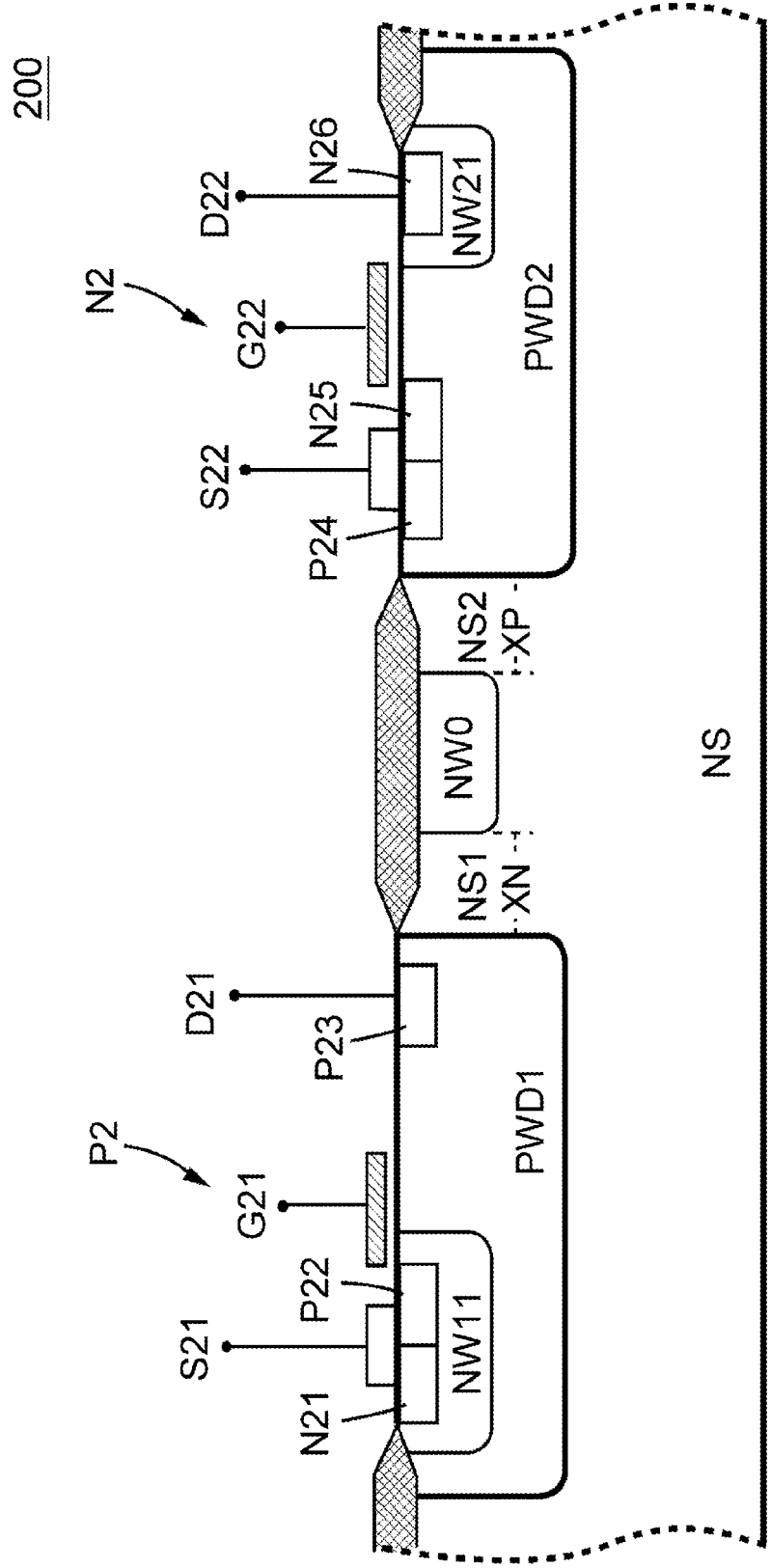
FIG. 2 shows a schematic diagram of a high side semiconductor structure according to the second embodiment of the invention.

Referring to FIG. 2, a schematic diagram of a high side semiconductor 200 structure according to the first embodiment of the invention is shown. The high side semiconductor structure 200 of the present embodiment differs with the high side semiconductor structure 100 of the first embodiment in the type of ion doping, and the similarities are not repeated below.

In the present embodiment of the invention, the substrate NS is realized by an N-type substrate, the first deep well PWD1 and the second deep well PWD2 both are realized by a P-type deep well. The first active element P2 is realized by a P-type metal oxide semiconductor (PMOS), and the second active element N2 is realized by an N-type metal oxide semiconductor (NMOS).

The first active element P2 includes a gate G21, a source S21, a drain D21, a doped well NW11 and three heavy ion doped regions N21, P22, P23. The N-type doped well NW11 is formed in the P-type first deep well PWD1. The N-type heavy ion doped region N21 and the P-type heavy ion doped region P22 are formed in the N-type doped well NW11. The P-type heavy ion doped region P23 is formed in the P-type first deep well PWD1. The source S21 is disposed on the N-type heavy ion doped region N21 and the P-type heavy ion doped region P22. The drain D21 is disposed on P-type heavy ion doped region P23. The gate G21 is disposed on the P-type first deep well PWD1.

In the present embodiment of the invention, the second active element N2 includes a gate G22, a source S22, a drain D22, a doped well NW21 and three heavy ion doped regions P24, N25, N26. The N-type doped well NW21 is formed in the P-type second deep well PWD2. The P-type heavy ion doped region P24 and the N-type heavy ion doped region N25 are formed in the P-type second deep well PWD2. The N-type heavy ion doped region N26 is formed in the N-type doped well NW21. The source S22 is disposed on the P-type heavy ion doped region P24 and the N-type heavy ion doped region N25. The drain D22 is disposed on the N-type heavy ion doped region N26. The gate G22 is disposed on the P-type second deep well PWD2.

The doped well NW0 is formed in the substrate NS, and is disposed between the first deep well PWD1 and the second deep well PWD2. In the present embodiment of the invention, the doped well NW0 is realized by an N-type doped well.

A first gap region NS1 is disposed between the doped well NW0 and the first deep well PWD1 and a second gap region NS2 is disposed between the doped well NW0 and the second deep well PWD2. What is interposed between the first gap region NS1 and the second gap region NS2 is the N-type substrate NS, not the N-type doped well NW0.

In the present embodiment of the invention, a P-N junction is formed between the P-type first deep well PWD1 and the N-type first gap region NS1. What is connected to the P-type first deep well PWD1 is the N-type first gap region NS1, not the N-type doped well NW0. The ion doping concentration of the N-type first gap region NS1 is lower than that of the N-type doped well NW0, so that the depletion region of N-type first gap region NS1 is thicker, and the reference withstanding voltage is larger.

The results of several experiments show that when the P-type first deep well PWD1 and the N-type doped well NW0 are interconnected, the reference withstanding voltage is 50V, but when the P-type first deep well PWD1 and the N-type first gap region NS1 are interconnected, the reference withstanding voltage is increased to 100V.

Likewise, in the present embodiment of the invention, a P-N junction is formed between the P-type second deep well PWD2 and the N-type second gap region NS2. What is connected to the P-type second deep well PWD2 is the N-type second gap region NS2, not the N-type doped well NW0. The ion doping concentration of the N-type second gap region NS2 is lower than that of the N-type doped well NW0, so that the depletion region of the N-type second gap region NS2 is thicker and the reference withstanding voltage is larger.

The results of several experiments show that when the P-type second deep well PWD2 and the N-type doped well NW0 are interconnected, the reference withstanding voltage is 50V, but when the P-type second deep well PWD2 and the N-type second gap region NS2 are interconnected, the reference withstanding voltage is increased to 100V.

Through the disposition of the first gap region and the second gap region, the high side semiconductor structure disclosed in the above embodiments of the invention has many advantages exemplified below:

Firstly, the reference withstanding voltage of the high side semiconductor structure is increased significantly, such as from 50V to 100V.

Secondly, the high side semiconductor structure still maintains the original operating voltage such as 30V.

Thirdly, no extra manufacturing process or material is required.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high side semiconductor structure, comprising:
a substrate;
a first deep well and a second deep well formed in the substrate, wherein the first deep well and the second deep well have identical type of ion doping which is complementary with that of the substrate;
a first active element and a second active element respectively formed in the first deep well and the second deep well; and
a doped well formed in the substrate and between the first deep well and the second deep well, wherein the doped well, the first deep well and the second deep well are interspaced, and the type of ion doping of the first deep well and the second deep well are complementary with that of the doped well,
wherein the substrate between the first active element and the second active element is active-element-free, the first active element is one type of an N-type and P-type metal oxide semiconductor, and the second active element is another type of the N-type and P-type metal oxide semiconductor.

2. The semiconductor structure according to claim 1, wherein a first gap region is disposed between the doped well and the first deep well, and a second gap region is disposed between the doped well and the second deep well.

3. The semiconductor structure according to claim 2, wherein the width of the first gap region is substantially identical to that of the second gap region.

4. The semiconductor structure according to claim 2, the width of the first gap region and that of the second gap region are both greater than 4 µm.

5. The semiconductor structure according to claim 1, wherein a first gap region is disposed between the doped well and the first deep well, a second gap region is disposed between the doped well and the second deep well, and the doping concentrations of the first gap region and the second gap region are both lower than the doping concentration of the doped well.

6. The semiconductor structure according to claim 1, wherein the substrate is a P-type substrate, each of the first deep well and the second deep well is an N-type deep well.

7. The semiconductor structure according to claim 6, wherein the doped well is a P-type doped well.

8. The semiconductor structure according to claim 1, wherein the substrate is an N-type substrate, and each of the first deep well and the second deep well is a P-type deep well.

9. The semiconductor structure according to claim 8, wherein the doped well is an N-type doped well.

10. The semiconductor structure according to claim 1, wherein the first active element is an N-type metal oxide semiconductor (NMOS), and the second active element is a P-type metal oxide semiconductor (PMOS).

* * * * *